US009564232B1

(12) United States Patent
Lee

(10) Patent No.: US 9,564,232 B1
(45) Date of Patent: Feb. 7, 2017

(54) SEMICONDUCTOR MEMORY DEVICE

(71) Applicant: SK hynix Inc., Icheon-si Gyeonggi-do (KR)

(72) Inventor: Hee Youl Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/052,364

(22) Filed: Feb. 24, 2016

(30) Foreign Application Priority Data

Sep. 25, 2015 (KR) .......................... 10-2015-0136168

(51) Int. Cl.
*G11C 11/34* (2006.01)
*G11C 16/14* (2006.01)

(52) U.S. Cl.
CPC ..................... *G11C 16/14* (2013.01)

(58) Field of Classification Search
CPC ....................................................... G11C 16/14
USPC ............. 365/185.18, 185.17, 185.19, 185.24
See application file for complete search history.

(56) References Cited

U.S. PATENT DOCUMENTS

| 5,621,684 | A * | 4/1997 | Jung ....................... G11C 16/08 |
| | | | 365/185.17 |
| 7,054,195 | B2 * | 5/2006 | Matsunaga ............... 365/185.11 |
| 9,245,642 | B1 * | 1/2016 | Chen ................... G11C 16/3427 |
| 9,330,766 | B1 * | 5/2016 | Jung ....................... G11C 16/10 |
| 9,466,339 | B2 * | 10/2016 | Leem ....................... G11C 7/00 |
| 2002/0126532 | A1 * | 9/2002 | Matsunaga ........ G11C 16/0483 |
| | | | 365/185.17 |
| 2005/0105359 | A1 * | 5/2005 | Matsunaga ................... 365/222 |
| 2005/0213385 | A1 * | 9/2005 | Hosono .................. G11C 16/08 |
| | | | 365/185.17 |
| 2005/0254309 | A1 * | 11/2005 | Kwon ................ G11C 16/0483 |
| | | | 365/185.28 |
| 2006/0239069 | A1 * | 10/2006 | Kamigaichi ........ G11C 16/0483 |
| | | | 365/185.01 |
| 2006/0279992 | A1 * | 12/2006 | Park ................... G11C 16/0483 |
| | | | 365/185.17 |
| 2007/0025125 | A1 * | 2/2007 | Nakahori ................ H02M 1/32 |
| | | | 363/56.02 |
| 2007/0025152 | A1 * | 2/2007 | Futatsuyama ...... G11C 16/0483 |
| | | | 365/185.17 |
| 2007/0258276 | A1 * | 11/2007 | Higashitani ........ G11C 16/0483 |
| | | | 365/10 |
| 2007/0291542 | A1 * | 12/2007 | Aritome ............. G11C 16/0483 |
| | | | 365/185.18 |

(Continued)

FOREIGN PATENT DOCUMENTS

| KR | 1020090036839 A | 4/2009 |
| KR | 1020150106658 A | 9/2015 |

*Primary Examiner* — Viet Q Nguyen
(74) *Attorney, Agent, or Firm* — William Park & Associates Ltd.

(57) ABSTRACT

Provided herein is a semiconductor memory device including a memory cell array including a drain select transistor and a plurality of memory cells, a voltage generator configured to apply a program voltage, first and second pass voltages, and a drain control voltage to the memory cell array, a control logic configured to control the voltage generator so that during a program operation, after the program voltage is applied to a selected one of the plurality of memory cells, the program voltage applied to the selected memory cell is discharged while the first pass voltage or the second pass voltage is applied to memory cells adjacent to the selected memory cell.

7 Claims, 19 Drawing Sheets

(56) References Cited

U.S. PATENT DOCUMENTS

| | | | | |
|---|---|---|---|---|
| 2008/0049502 A1* | 2/2008 | Byeon | ............... | G11C 16/0483 365/185.05 |
| 2008/0084747 A1* | 4/2008 | Hemink | ............... | G11C 7/1006 365/185.18 |
| 2008/0089130 A1* | 4/2008 | Park | ............... | G11C 8/08 365/185.18 |
| 2009/0040833 A1* | 2/2009 | Shin | ............... | G11C 16/0483 365/185.19 |
| 2009/0129170 A1* | 5/2009 | Lee | ............... | G11C 16/3418 365/185.25 |
| 2010/0054036 A1* | 3/2010 | Lee | ............... | G11C 16/0483 365/185.03 |
| 2010/0067305 A1* | 3/2010 | Park | ............... | G11C 16/12 365/185.19 |
| 2011/0007572 A1* | 1/2011 | Ueno | ............... | G11C 11/5628 365/185.22 |
| 2011/0013458 A1* | 1/2011 | Seol | ............... | G11C 16/0483 365/185.18 |
| 2011/0026331 A1* | 2/2011 | Dong | ............... | G11C 16/0483 365/185.19 |
| 2011/0032757 A1* | 2/2011 | Dutta | ............... | G11C 11/5628 365/185.02 |
| 2011/0286276 A1* | 11/2011 | Lin | ............... | G11C 16/0483 365/185.18 |
| 2012/0281487 A1* | 11/2012 | Sakaniwa | ............... | G11C 16/10 365/189.16 |
| 2013/0010549 A1* | 1/2013 | Aritome | ............... | G11C 16/0483 365/189.011 |
| 2013/0100747 A1* | 4/2013 | Leem | ............... | G11C 7/00 365/189.011 |
| 2013/0148430 A1* | 6/2013 | Shiino et al. | ............... | G11C 16/10 365/185.18 |
| 2013/0182505 A1* | 7/2013 | Liu et al. | ............... | G11C 16/10 365/185.17 |
| 2013/0242666 A1* | 9/2013 | Izumi et al. | ............... | G11C 16/12 365/185.19 |
| 2014/0133238 A1* | 5/2014 | Rhie | ............... | G11C 16/10 365/185.17 |
| 2014/0211563 A1* | 7/2014 | Chang | ............... | G11C 16/3459 365/185.03 |
| 2014/0241068 A1* | 8/2014 | Izumida et al. | ............... | G11C 16/3459 365/185.22 |
| 2015/0262680 A1* | 9/2015 | Kobayashi | ............... | G11C 16/10 365/185.18 |
| 2015/0294726 A1* | 10/2015 | Sim | ............... | G11C 16/10 365/185.12 |
| 2016/0260483 A1* | 9/2016 | Shano et al. | ............... | G11C 16/08 |
| 2016/0267990 A1* | 9/2016 | Bushnaq et al. | ............... | G11C 16/10 |

* cited by examiner

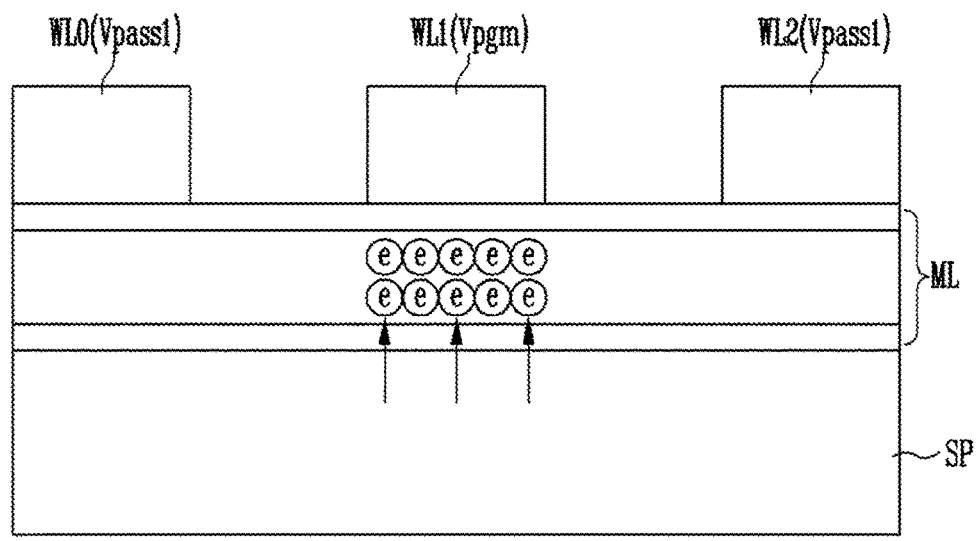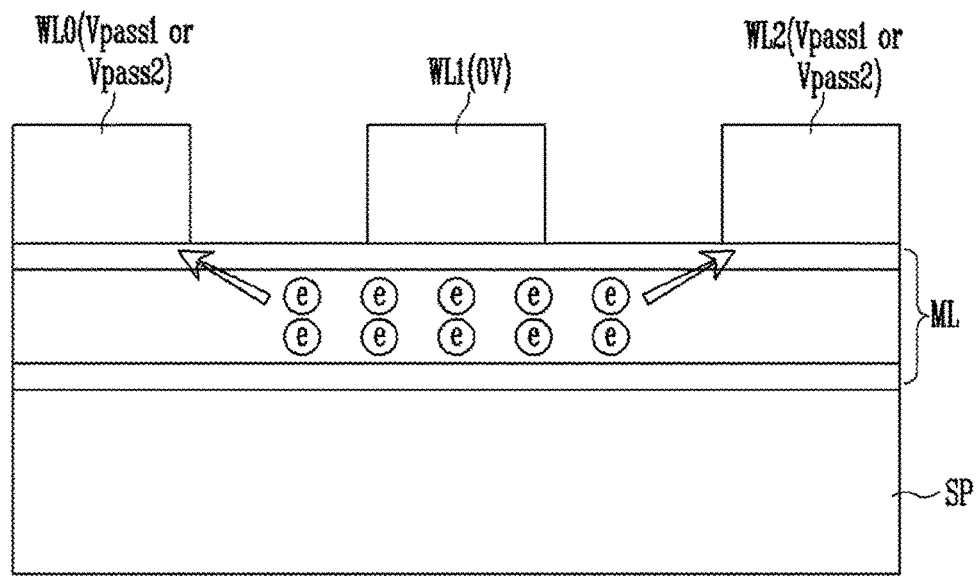

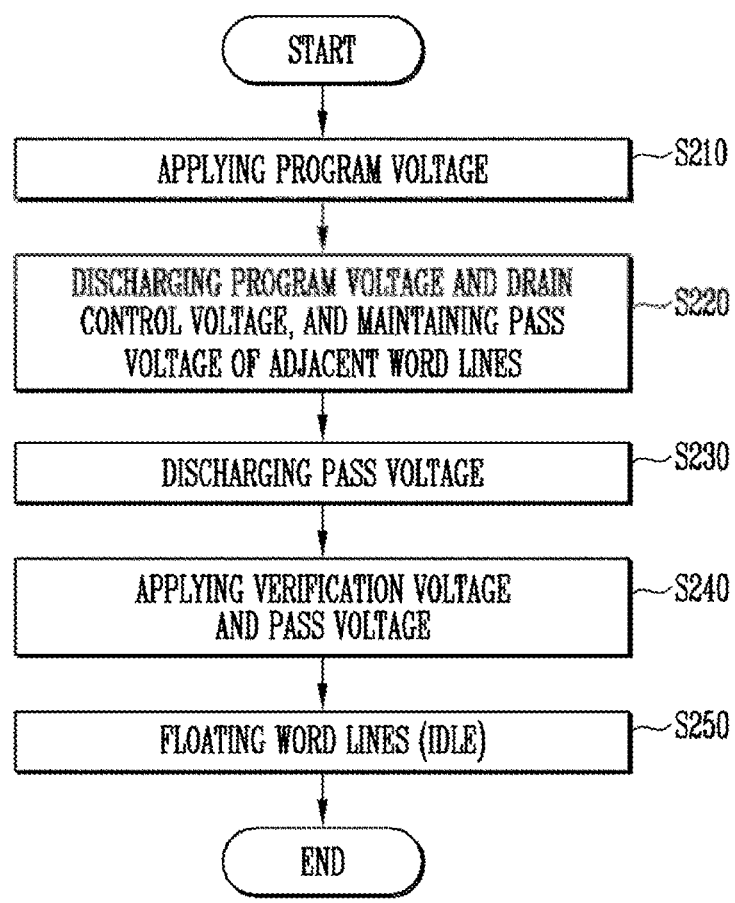

SECTION A

SECTION B

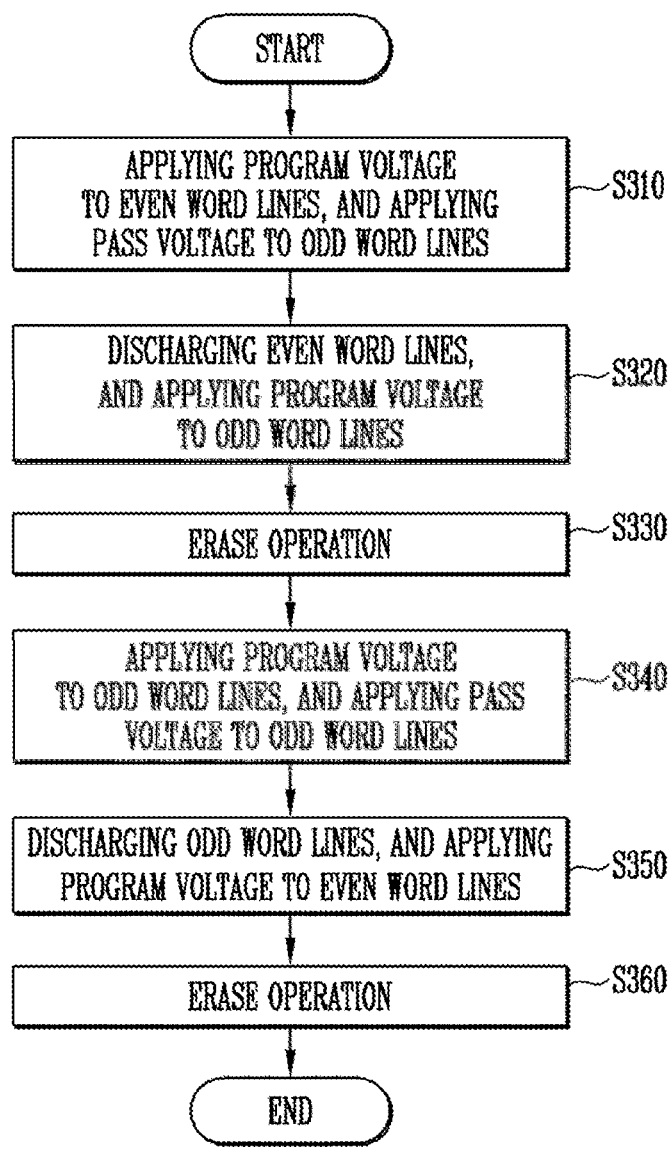

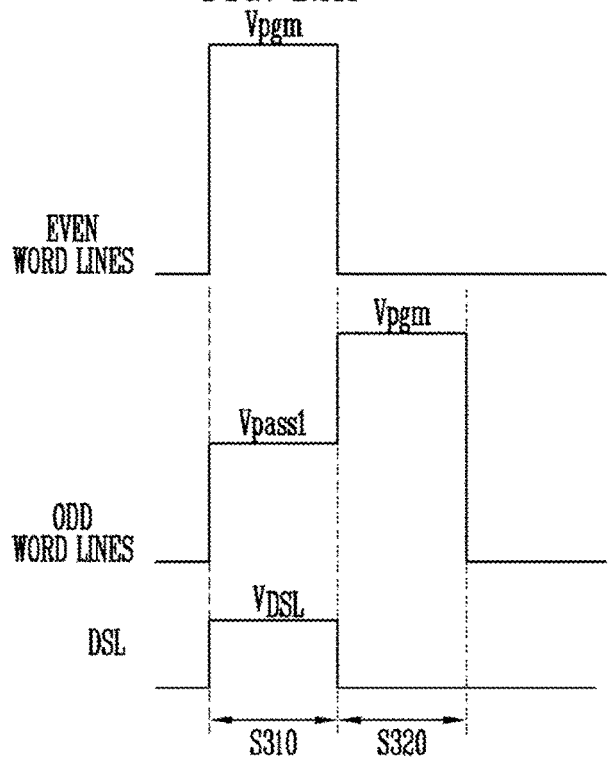
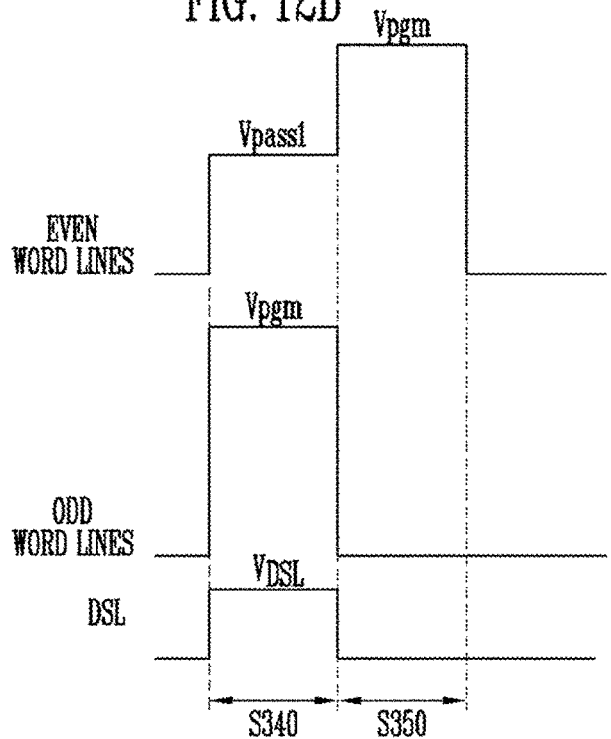

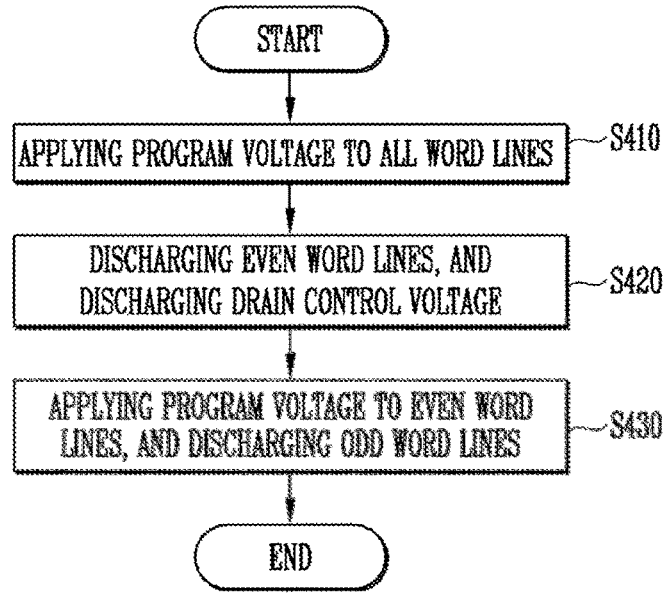
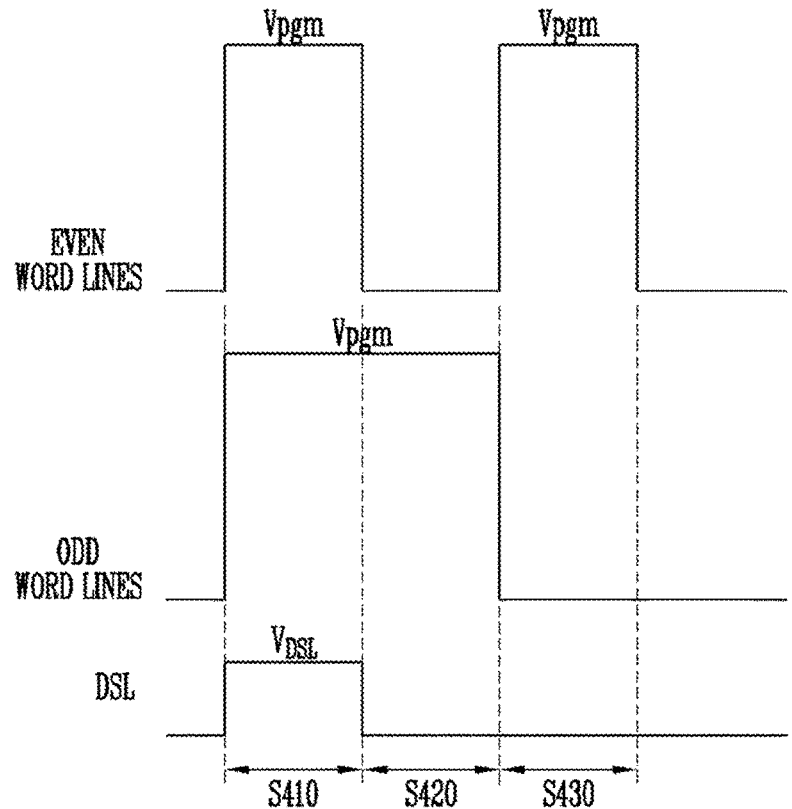

SEMICONDUCTOR MEMORY DEVICE

CROSS-REFERENCE TO RELATED APPLICATION

The present application claims priority to Korean patent application number 10-2015-0136168 filed on Sep. 25, 2015 the entire disclosure of which is incorporated herein in its entirety by reference.

BACKGROUND

1. Technical Field

Various embodiments of the present disclosure generally relate to an electronic device, and more particularly, to a semiconductor memory device.

2. Related Art

Semiconductor devices, in particular, semiconductor memory devices may be classified into volatile memory devices and nonvolatile memory devices.

The nonvolatile memory device can maintain data stored therein even when power is turned off, although read and write speeds are comparatively low. Therefore, the nonvolatile memory device is used when there is the need for storing data which must be maintained regardless of supply of power. Representative examples of the nonvolatile memory device include read-only memory (ROM), mask ROM (MROM), programmable ROM (PROM), erasable programmable ROM (EPROM), electrically erasable programmable ROM (EEPROM), flash memory, phase-change random access memory (PRAM), magnetic RAM (MRAM), resistive RAM (RRAM), ferroelectric RAM (FRAM), etc. Flash memory may be classified into NOR type and NAND type memory.

The flash memory has both advantages of RAM in which data is programmable and erasable and advantages of ROM in which data stored therein can be retained even when power is interrupted. Such flash memory is widely used as a storage medium of portable electronic devices such as a digital camera, a personal digital assistant (PDA) and MP3.

The flash memory may be classified into a two-dimensional semiconductor device in which strings are horizontally formed on a semiconductor substrate, and a three-dimensional semiconductor device in which strings are vertically formed on a semiconductor substrate.

Three-dimensional semiconductor devices are memory devices which are devised to overcome the limitation in the degree of integration of two-dimensional semiconductor devices and include a plurality of strings which are vertically formed on a semiconductor substrate. Each string includes a drain select transistor, which is coupled in series between a bit line and a source line, a plurality of memory cells, and a source select transistor.

BRIEF DESCRIPTION OF THE DRAWINGS

FIGS. 7A to 7D are diagrams illustrating representations of examples of the movement of electric charges trapped in a memory layer of a memory cell during a program operation of the semiconductor memory device according to an embodiment of the present disclosure.

FIG. 8 is a flowchart illustrating a representation of an example of the operation of a semiconductor memory device according to an embodiment of the present disclosure.

FIG. 11 is a flowchart illustrating a representation of an example of the operation of a semiconductor memory device according to an embodiment of the present disclosure.

FIGS. 12A and 12B are waveform diagram representations of examples of signals applied to a memory cell array when the semiconductor memory device is operated according to an embodiment of the present disclosure.

FIG. 14 is a flowchart illustrating a representation of an example of the operation of a semiconductor memory device according to an embodiment of the present disclosure.

FIG. 15 is a waveform diagram representation of examples of signals applied to a memory cell array when the semiconductor memory device is operated according to an embodiment of the present disclosure.

DETAILED DESCRIPTION

Figure 1:
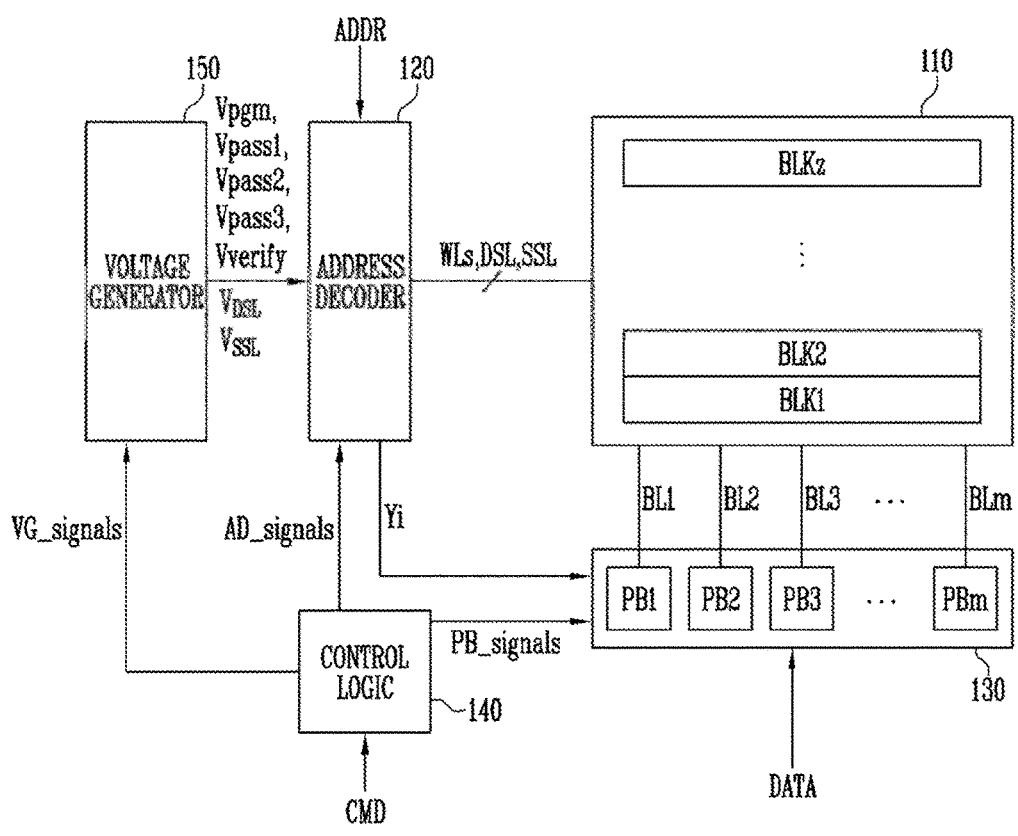
FIG. 1 is a block diagram illustrating a representation of an example of a semiconductor memory device according to the present disclosure.

Advantages and features of the present disclosure, and methods for achieving the same will be discussed with reference to examples of embodiments described later together with the accompanying drawings. Accordingly, the present disclosure is not limited to the following embodiments and may be embodied in other types. Rather, these embodiments are provided so that the present disclosure will be thorough, and complete, and will fully convey the technical spirit of the disclosure to those skilled in the art.

It will be understood that when an element is referred to as being "coupled" or "connected" to another element, it can be directly coupled or connected to the other element or intervening elements may be present therebteween. In the specification, when an element is referred to as "comprising" or "including" a component, it does not preclude another component but may further include other components unless the context clearly indicates otherwise.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Various embodiments of the present disclosure may be directed to a semiconductor memory device or method thereof which can mitigate variation in threshold voltage due to retention deterioration characteristics during a program operation.

An embodiment of the present disclosure may provide a semiconductor memory device. The semiconductor memory device may include a memory cell array including a drain select transistor and a plurality of memory cells. The semiconductor memory device may include a voltage generator configured to apply a program voltage, first and second pass voltages, and a drain control voltage to the memory cell array. The semiconductor memory device may include a control logic configured to control the voltage generator so that during a program operation, after the program voltage is applied to a selected one of the plurality of memory cells, the program voltage applied to the selected memory cell is discharged while the first pass voltage or the second pass voltage is applied to memory cells adjacent to the selected memory cell.

An embodiment of the present disclosure may provide a semiconductor memory device. The semiconductor memory device may include a memory cell array including a plurality of memory cells and a drain select transistor. The semiconductor memory device may include a voltage generator configured to apply a program voltage or a pass voltage to word lines of the memory cell array. The semiconductor memory device may include a control logic configured to control the voltage generator so that before a program operation, the pass voltage is applied to odd ones of the word lines while the program voltage is applied to even ones of the word lines, and then the program voltage is applied to the odd word lines while a potential of the even word lines is discharged.

An embodiment of the present disclosure may provide a semiconductor memory device. The semiconductor memory device may include a memory cell array including a plurality of memory cells and a drain select transistor. The semiconductor memory device may include a voltage generator configured to apply a program voltage or a pass voltage to word lines of the memory cell array. The semiconductor memory device may include a control logic configured to control the voltage generator so that after the program voltage is applied to the word lines before a program operation, a potential of even ones of the word lines and a potential of odd ones of the word lines are alternately discharged.

FIG. 1 is a block diagram illustrating a representation of an example of a semiconductor memory device according to the present disclosure.

Referring to FIG. 1, a semiconductor memory device 100 may include a memory cell array 110, an address decoder 120, a read-and-write circuit 130, a control logic 140, and a voltage generator 150.

The memory cell array 110 may include a plurality of memory blocks BLK1 to BLKz. The memory blocks BLK1 to BLKz are coupled to the address decoder 120 through a plurality of word lines WLs, a drain select line DSL, and a source select line SSL. The memory blocks BLK1 to BLKz are coupled to the read-and-write circuit 130 through bit lines BL1 to BLm. Each of the memory blocks BLK1 to BLKz includes a plurality of memory cells. In an embodiment, the memory cells are nonvolatile memory cells, and in particular, the memory cells may be charge trap device-based nonvolatile memory cells. Memory cells coupled to the same word line among the plurality of memory cells are defined as one page. In other words, the memory cell array 110 is formed of a plurality of pages. Each of the memory blocks BLK1 to BLKz of the memory cell array 110 includes a plurality of memory strings. Each of the memory strings includes a drain select transistor, a plurality of memory cells, and a source select transistor which are coupled in series between a corresponding bit line and a source line.

The address decoder 120, the read-and-write circuit 130, and the voltage generator 150 may function as peripheral circuits for driving the memory cell array 110.

The address decoder 120 is coupled to the memory cell array 110 through the plurality of word lines WLs, the drain select line DSL, and the source select line SSL. The address decoder 120 is configured to be operated under control signals AD_signals outputted from the control logic 140. The address decoder 120 receives an address ADDR through an input/output buffer (not illustrated) provided in the semiconductor memory device 100.

The address decoder 120 applies a program voltage Vpgm, a plurality of pass voltages Vpass1, Vpass2, and Vpass3, a verification voltage Vverify, a drain control voltage VDSL, and a source control voltage VSSL, which are generated from the voltage generator 150, to the word lines WLs, the drain select line DSL, and the source select SSL of the memory cell array 110.

A program operation of the semiconductor memory device 100 is performed in pages. Addresses ADDR received in a request for the program operation include a block address, a row address, and a column address. The address decoder 120 selects a corresponding one of the memory blocks and a corresponding one of the word lines in accordance with the block address and the row address. The column address Yi is decoded by the address decoder 120 and provided to the read-and-write circuit 130.

The address decoder 120 may include a block decoder, a row decoder, a column decoder, an address buffer, etc.

The read-and-write circuit 130 includes a plurality of page buffers PB1 to PBm. The page buffers PB1 to PBm are coupled to the memory cell array 110 through bit lines BL1 to BLm. Each of the page buffers PB1 to PBm temporarily stores data DATA inputted during the program operation and controls the potential of a corresponding one of the bit lines BL1 to BLm in accordance with the temporarily stored data. Each of the page buffers PB1 to PBm senses current and voltage of a corresponding one of the bit lines BL1 to BLm while performing a verification operation of the program operation.

The read-and-write circuit 130 is operated under control signals PB_signals outputted from the control logic 140.

The control logic 140 is coupled to the address decoder 120, the read-and-write circuit 130, and the voltage generator 150. The control logic 140 receives a command CMD through the input/output buffer (not illustrated) provided in the semiconductor memory device 100. The control logic 140 is configured to control the overall operation of the semiconductor memory device 100 in response to the command CMD.

The control logic 140 may control the voltage generator 150 and the address decoder 120 so that during the program operation, electrons are dispersed and trapped in a trap layer between the memory cells. This will be explained below in the accompanying description of a method of operating the semiconductor memory device.

The voltage generator 150 is operated under control signals VG_signals outputted from the control logic 140.

The voltage generator 150 generates a program voltage Vpgm to be applied to a selected word line, first and second pass voltages Vpass1 and pass2 to be applied to non-selected word lines, a verification voltage Vverify to be applied to the selected word line during a verification operation, and a third pass voltage Vpass3 to be applied to the non-selected word lines during the verification operation. The potential level of the second pass voltage Vpass1 may be higher than that of the first pass voltage Vpass1.

Figure 2:
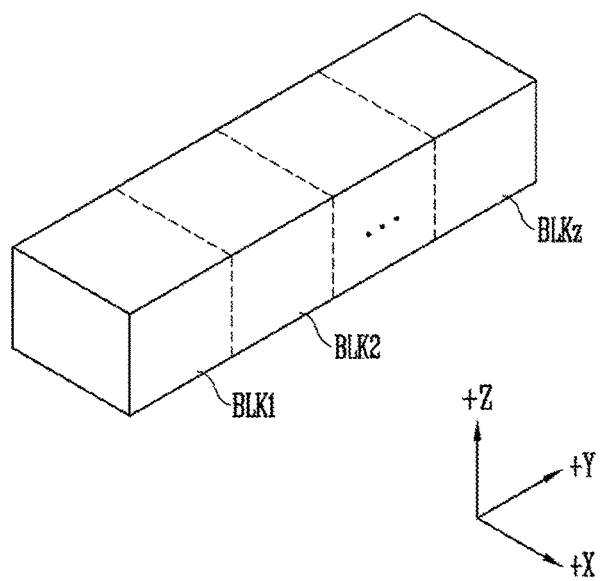
FIG. 2 is a block diagram illustrating a representation of an example of an embodiment of a memory cell array of FIG. 1.

FIG. 2 is a block diagram illustrating a representation of an example of an embodiment of the memory cell array 110 of FIG. 1.

Referring to FIG. 2, the memory cell array 110 may include the plurality of memory blocks BLK1 to BLKz. Each memory block has a three-dimensional structure. Each memory block includes a plurality of memory cells stacked on a substrate. The memory cells are arranged in +X, +Y, and +z directions. The structure of each memory block will be described later herein with reference to FIGS. 3 and 4.

Figure 3:
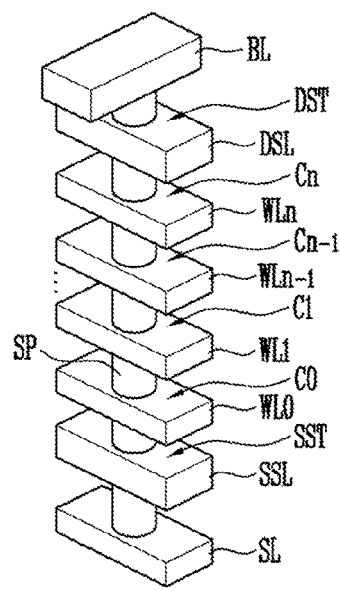
FIG. 3 is a three-dimensional view illustrating a representation of an example of a memory string included in a memory block according to the present disclosure.
Figure 4:
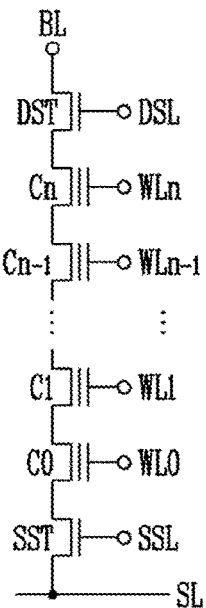
FIG. 4 is a circuit diagram illustrating a representation of an example of the memory string illustrated in FIG. 3.

FIG. 3 is a three-dimensional view illustrating a representation of an example of a memory string included in each memory block according to the present disclosure. FIG. 4 is a circuit diagram illustrating a representation of an example of the memory string.

Referring to FIGS. 3 and 4, a source line SL is formed on a semiconductor substrate. A vertical channel layer SP is formed on the source line SL. An upper portion of the vertical channel layer SP is coupled to a corresponding bit line BL. The vertical channel layer SP may be made of polysilicon. A plurality of conductive layers SSL, WL0 to WLn, and DSL are formed at different heights on the vertical channel layer SP in such a way each of the conductive layers encloses the vertical channel layer SP. A multilayer film (not illustrated) including a charge storage layer is formed on a surface of the vertical channel layer SP. The multilayer film is also disposed between the vertical channel layer SP and the conductive layers SSL, WL0 to WLn, and DSL. The multilayer film may be formed in an ONO structure in which an oxide layer, a nitride layer, and an oxide layer are successively stacked.

The lowermost conductive layer forms a source select line SSL. The uppermost conductive layer forms a drain select line DSL. The conductive layers disposed between the select lines SSL and DSL form the respective word lines WL0 to WLn. In other words, the conductive layers SSL, WL0 to WLn, and DSL are formed in a multilayer structure on the semiconductor substrate. The vertical channel SP passing through the conductive layers SSL, WL0 to WLn, and DSL is vertically coupled between the bit line BL and the source line SL formed on the semiconductor substrate.

The drain select transistor DST is formed on a portion of the uppermost conductive layer DSL that encloses the vertical channel layer SP. The source select transistor SST is formed on a portion of the lowermost conductive layer SSL that encloses the vertical channel layer SP. Memory cells C0 to Cn are formed on portions of the intermediate conductive layers WL0 to WLn that enclose the vertical channel layer SP.

The memory string may include the source select transistor SST, the memory cells C0 to Cn, and the drain select transistor DST, which are vertically coupled to the substrate between the source line SL and the bit line BL. The source select transistor SST electrically connects the memory cells C0 to Cn to the source line SL depending on a source control voltage applied to the source select line SSL. The drain select transistor DST electrically connects the memory cells C0 to Cn to the bit line BL depending on a drain control voltage applied to the drain select line DSL.

Figure 5:
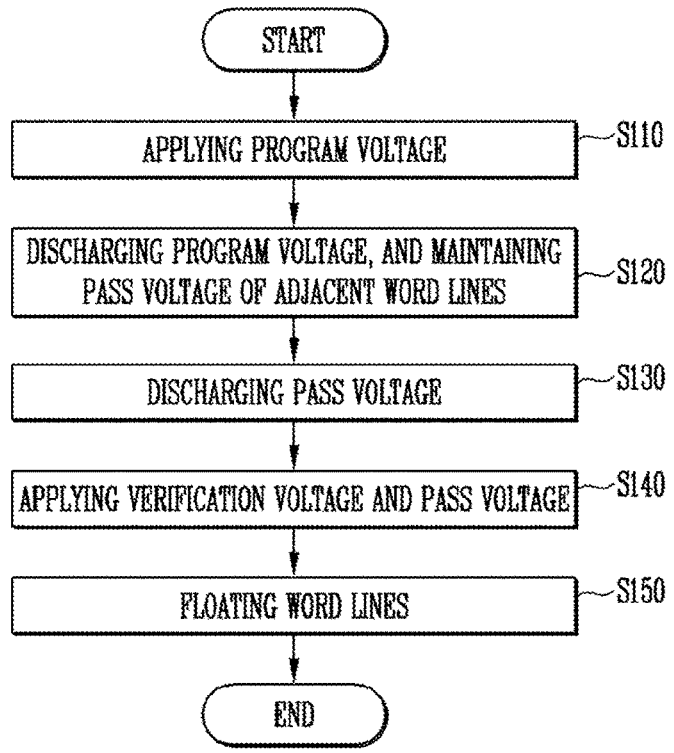
FIG. 5 is a flowchart illustrating a representation of an example of the operation of the semiconductor memory device according to an embodiment of the present disclosure.

FIG. 5 is a flowchart illustrating a representation of an example of the operation of the semiconductor memory device according to an embodiment of the present disclosure.

Figure 6:
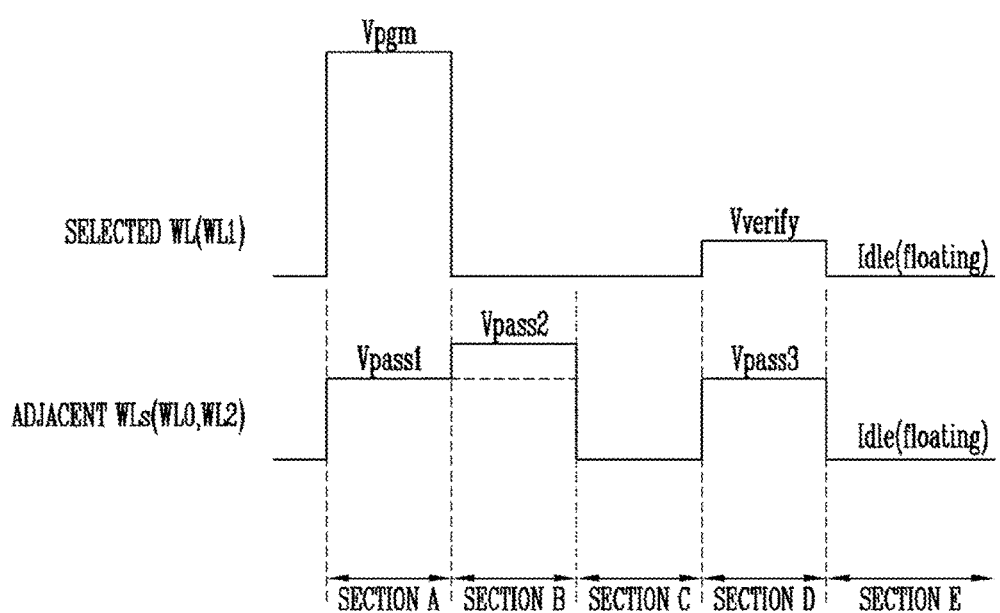
FIG. 6 is a waveform diagram representation of examples of signals applied to the memory cell array when the semiconductor memory device is operated according to an embodiment of the present disclosure.

FIG. 6 is a waveform diagram representation of examples of signals applied to the memory cell array when the semiconductor memory device is operated according to an embodiment of the present disclosure.

FIGS. 7A to 7D are diagrams illustrating representations of examples of the movement of electric charges trapped in a memory layer of a memory cell during a program operation of the semiconductor memory device according to an embodiment of the present disclosure.

A method of operating the semiconductor memory device according to an embodiment of the present disclosure will be described with reference to FIGS. 1 to 7D.

1) Applying a Program Voltage (S110; Section A)

When a command CMD for performing a program operation of the semiconductor memory device is transmitted to the control logic 140, the control logic 140 outputs control signals PB_signals. In response to the control signals PB_signals outputted from the control logic 140, the read-and-write circuit 130 temporarily stores data DATA to be programmed, inputted from the outside, in the plurality of page buffers PB1 to PBm. Each of the page buffers PB1 to PBm temporarily stores data DATA inputted during the program operation and controls the potential of a corresponding one of the bit lines BL1 to BLm in accordance with the temporarily stored data.

The voltage generator 150 generates a program voltage Vpgm and a first pass voltage Vpass1 in response to control signals VG_signals outputted from the control logic 140. In response to an address ADDR and control signals AD_signals outputted from the control logic 140, the address decoder 120 applies the program voltage Vpgm to a selected word line (e.g., WL1) of the word lines WLs and applies the first pass voltage Vpass1 to the other unselected word lines (e.g., WL0 and WL2).

As illustrated in FIG. 7A, electric charges ( ) are drawn from the vertical channel layer SP into the memory layer ML of the selected memory cell coupled to the selected word line WL1 and are trapped in the memory layer ML. Thereby, the threshold voltage of the selected memory cell is increased.

2) Discharging the Program Voltage and Maintaining the Pass Voltage of the Adjacent Word Lines (S120; Section B)

After section A, the voltage generator 150 discharges the potential level of the program voltage Vpgm that has been applied to the selected word line (e.g., WL1) to a voltage of 0V. The voltage generator 150 continuously applies the first pass voltage Vpass1 to the word lines (e.g., WL0 and WL2) adjacent to the selected word line (e.g., WL1) or applies a second pass voltage Vpass2 higher in potential level than the first pass voltage Vpass1 to the adjacent word lines (WL0 and WL2).

Referring to FIG. 7B, an electric field is formed by the first pass voltage Vpass1 or the second pass voltage Vpass2 applied to the word lines WL0 and WL2 adjacent to the selected word line WL1, so that some of the electric charges ( ) trapped in the memory layer ML of the selected cell move in both side directions. That is, some of the electric charges ( ) move to portions of the memory layer ML that are defined between the selected memory cell and the adjacent memory cells.

3) Discharging the Pass Voltage (S130; Section C)

After section B, the voltage generator 150 discharges the potential level of the first pass voltage Vpass1 or the second pass voltage Vpass2 that has been applied to the adjacent word lines WL0 and WL2 to a voltage of 0V.

Figure 7C:
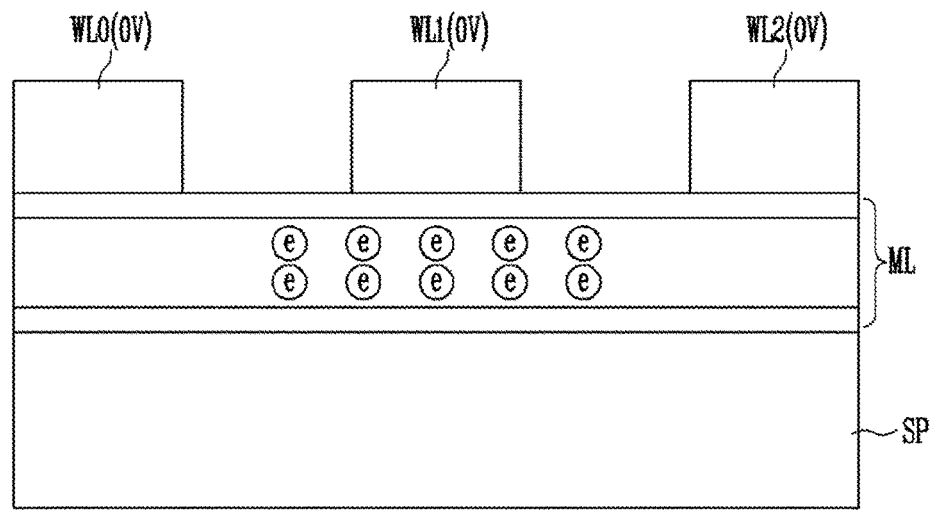
Figure 7D:
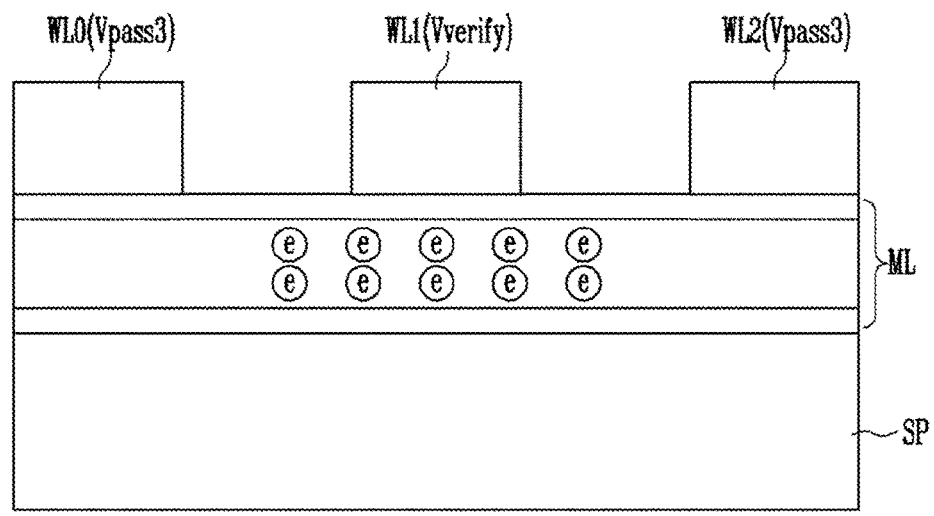

Referring to FIG. 7C, the electric charges ( ) that have moved to the portions of the memory layer ML defined between the selected memory cell and the adjacent memory cells and the electric charges ( ) trapped in the memory layer ML of the selected memory cell are rearranged. Therefore, a short-time retention characteristic, in which electric charges ( ) move to adjacent regions within a short time after having been trapped in the memory layer ML and thus the threshold voltage reduces, is reflected in the threshold voltage of the selected memory cell.

4) Applying a Verification Voltage and a Pass Voltage (S140; Section D)

After section C, the voltage generator 150 generates a verification voltage Vverify and a third pass voltage Vpass3 in response to control signals VG_signals outputted from the control logic 140. In response to an address ADDR and control signals AD_signals outputted from the control logic 140, the address decoder 120 applies the verification voltage Vverify to the selected word line (e.g., WL1) of the word lines WLs and applies the third pass voltage Vpass3 to the other unselected word lines (e.g., WL0 and WL2).

Each of the page buffers PB1 to PBm of the read-and-write circuit 130 senses, in response to control signals PB_signals outputted from the control logic 140, the potential level or current of the corresponding one of the bit lines BL1 to BLm and thus performs a verification operation.

5) Floating the Word Lines (S150; Section E)

After section D, the voltage generator 150 discharges the verification voltage Vverify applied to the selected word line (e.g., WL1) and the third voltage Vpass3 to a voltage of 0V. The address decoder 120 floats the word lines WLs such that the word lines WLs are in an idle state.

After the word line floating step S150 has been performed, when the result of the verification operation is determined as fail, the program voltage Vpgm is increased by a step voltage, and the operation of the semiconductor memory device is re-performed from the above-mentioned program voltage application step S110. When the result of the verification operation is determined as pass, a program operation for memory cells of a subsequent page may be performed.

According to an above-mentioned embodiment of the present disclosure, the verification operation is performed, after the electric charges trapped after the program voltage is applied have been rearranged by moving some of the electric charges in both side directions of the selected memory cell and the short-time retention characteristic has been reflected. Therefore, a problem of the threshold voltage distribution being reduced after the verification operation has been performed can be mitigated.

FIG. 8 is a flowchart illustrating a representation of an example of the operation of a semiconductor memory device according to an embodiment of the present disclosure.

Figure 9:
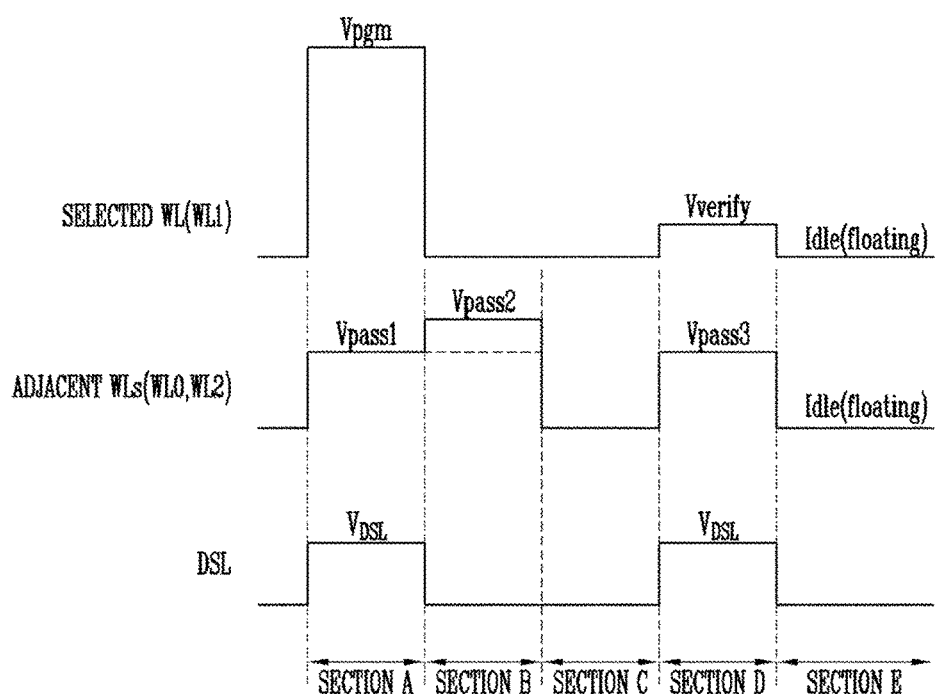
FIG. 9 is a waveform diagram representation of examples of signals applied to the memory cell array when the semiconductor memory device is operated according to an embodiment of the present disclosure.

FIG. 9 is a waveform diagram representation of examples of signals applied to the memory cell array when the semiconductor memory device is operated according to an embodiment of the present disclosure.

FIGS. 10A to 10D are diagrams illustrating representations of examples of the movement of electric charges trapped in a memory layer of a memory cell during a program operation of the semiconductor memory device according to an embodiment of the present disclosure.

A method of operating the semiconductor memory device according to an embodiment of the present disclosure will be described with reference to FIGS. 1 to 4 and 8 to 10D.

1) Applying a Program Voltage (S210; Section A)

When a command CMD for performing a program operation of the semiconductor memory device is transmitted to the control logic 140, the control logic 140 outputs control signals PB_signals. In response to the control signals PB_signals outputted from the control logic 140, the read-and-write circuit 130 temporarily stores data DATA to be programmed, inputted from the outside, in the plurality of page buffers PB1 to PBm. Each of the page buffers PB1 to PBm temporarily stores data DATA inputted during the program operation and controls the potential of a corresponding one of the bit lines BL1 to BLm in accordance with the temporarily stored data.

The voltage generator 150 generates a program voltage Vpgm, a first pass voltage Vpass1, and a drain control voltage VDSL in response to control signals VG_signals outputted from the control logic 140. In response to an address ADDR and control signals AD_signals outputted from the control logic 140, the address decoder 120 applies the program voltage Vpgm to a selected word line (e.g., WL1) of the word lines WLs, applies the first pass voltage Vpass1 to the other unselected word lines (e.g., WL0 and WL2), and applies the drain control voltage VDSL to the drain select line DSL.

Figure 10A:
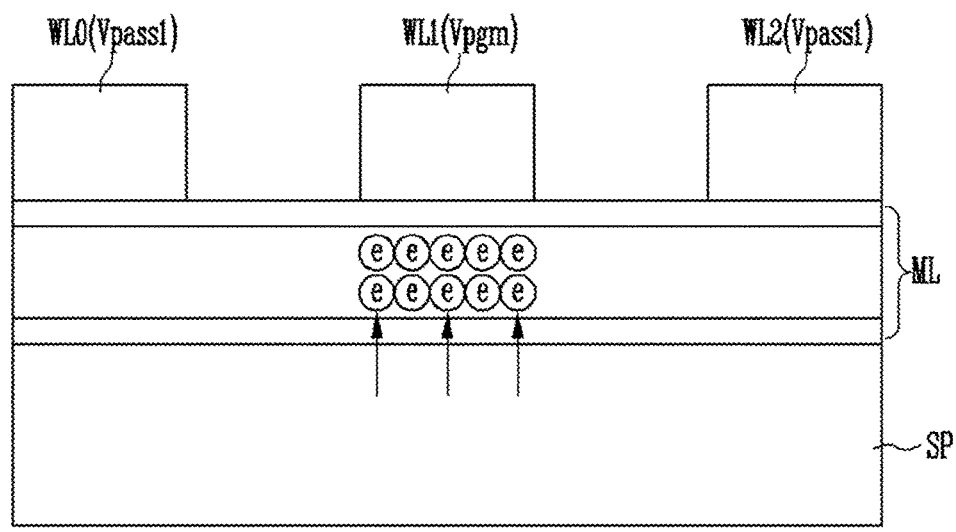
FIGS. 10A to 10D are diagrams illustrating representations of examples of the movement of electric charges trapped in a memory layer of a memory cell during a program operation of the semiconductor memory device according to an embodiment of the present disclosure.

As illustrated in FIG. 10A, electric charges ( ) are drawn from the vertical channel layer SP into the memory layer ML of the selected memory cell coupled to the selected word line WL1 and are trapped in the memory layer ML. Thereby, the threshold voltage of the selected memory cell is increased.

2) Discharging the Program Voltage and the Drain Control Voltage, and Maintaining the Pass Voltage of the Adjacent Word Lines (S220; Section B)

After section A, the voltage generator 150 discharges the potential level of the program voltage Vpgm that has been applied to the selected word line (e.g., WL1) to a voltage of 0V. The voltage generator 150 continuously applies the first pass voltage Vpass1 to the word lines (e.g., WL0 and WL2) adjacent to the selected word line (e.g., WL1) or applies a second pass voltage Vpass2 higher in potential level than the first pass voltage Vpass1 to the adjacent word lines (WL0 and WL2). The voltage generator 150 discharges the potential level of the drain control voltage VDSL applied to the drain select line DSL to a voltage of 0V. Thereby, the drain select transistor DST is turned off, whereby the vertical channel layer SP of the memory string is electrically separated from the corresponding bit line and thus enters a floating state. In this case, the source select transistor SST is in a turned-off state. Therefore, portions of the vertical channel layer that are close to the adjacent memory cells to which the first pass voltage Vpass1 or the second pass voltage Vpass2 are applied are boosted to a high potential level, and the selected memory cell to which a voltage of 0V is applied is boosted to a relatively low potential level.

Figure 10B:
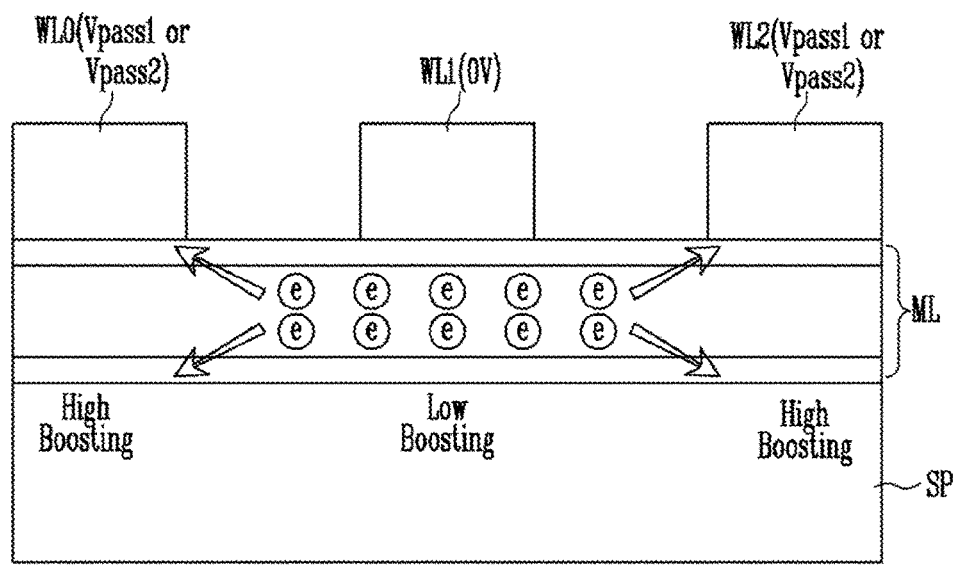

Thereby, as illustrated in FIG. 10B, an electric field is formed both by the first pass voltage Vpass1 or the second pass voltage Vpass2 applied to the word lines WL0 and WL2 adjacent to the selected word line WL1 and by the boosted potential of the portions of the vertical channel layer that are close to the word lines WL0 and WL2, so that some of the electric charges ( ) trapped in the memory layer ML of the selected cell move in both side directions. That is, some of the electric charges ( ) move to portions of the memory layer ML that are defined between the selected memory cell and the adjacent memory cells.

3) Discharging the Pass Voltage (S230; Section C)

After section B, the voltage generator 150 discharges the potential level of the first pass voltage Vpass1 or the second pass voltage Vpass2 that has been applied to the adjacent word lines WL0 and WL2 to a voltage of 0V.

Figure 10C:
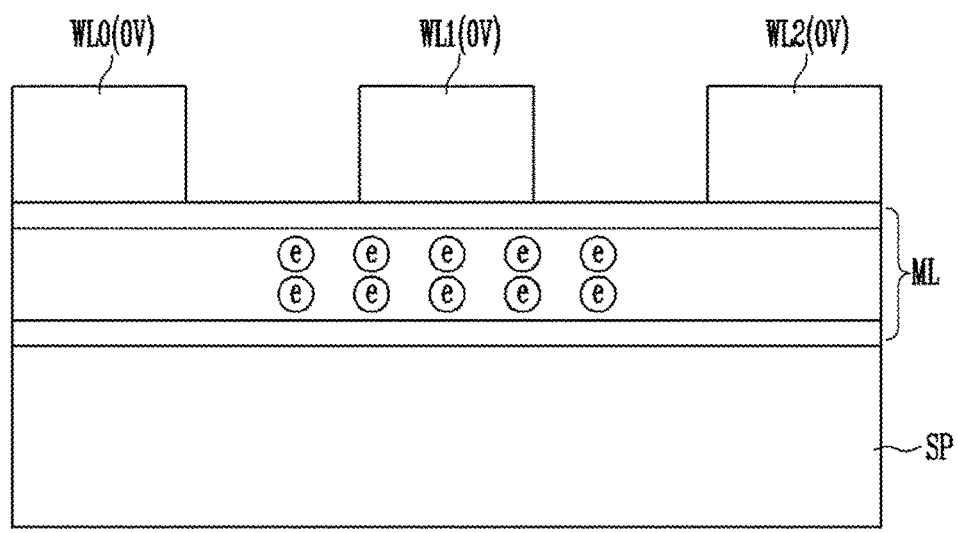
Figure 10D:
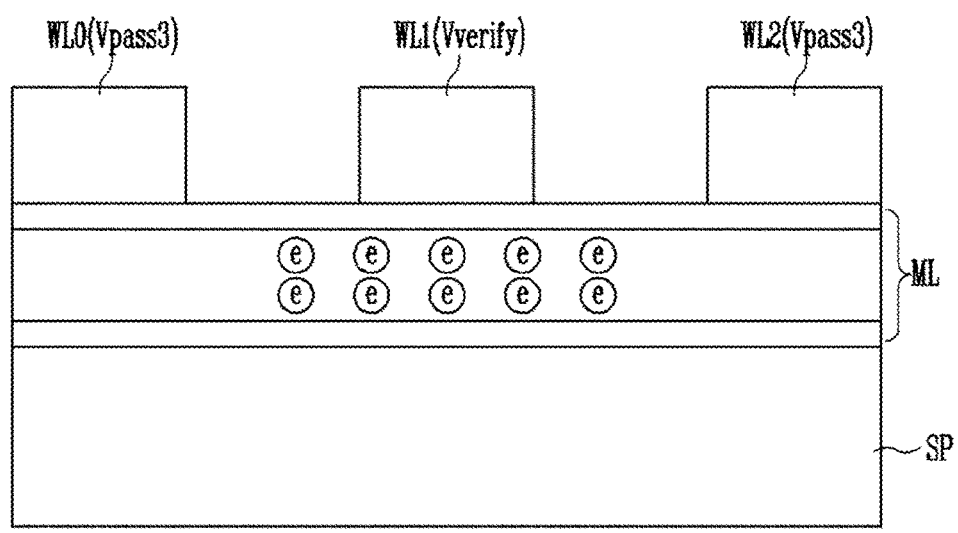

Thereby, as illustrated in FIG. 10C, the electric charges ( ) that have moved to the portions of the memory layer ML defined between the selected memory cell and the adjacent memory cells and the electric charges ( ) trapped in the memory layer ML of the selected memory cell are rearranged. Therefore, the short-time retention characteristic is reflected in the threshold voltage of the selected memory cell.

4) Applying a Verification Voltage and a Pass Voltage (S240; Section D)

After section C, the voltage generator 150 generates a verification voltage Vverify, a third pass voltage Vpass3, and a drain control voltage VDSL in response to control signals VG_signals outputted from the control logic 140. In response to an address ADDR and control signals AD_signals outputted from the control logic 140, the address decoder 120 applies the verification voltage Vverify to the selected word line (e.g., WL1) of the word lines WLs, applies the third pass voltage Vpass3 to the other unselected word lines (e.g., WL0 and WL2), and applies the drain control voltage VDSL to the drain select line DSL.

Each of the page buffers PB1 to PBm of the read-and-write circuit 130 senses, in response to control signals PB_signals outputted from the control logic 140, the potential level or current of the corresponding one of the bit lines BL1 to BLm and thus performs a verification operation.

5) Floating the Word Lines (S250)

After section D, the voltage generator 150 discharges the verification voltage Vverify applied to the selected word line (e.g., WL1), the third voltage Vpass3, and the drain control voltage VDSL to a voltage of 0V. The address decoder 120 floats the word lines WLs such that the word lines WLs are in an idle state.

After the word line floating step S250 has been performed, when the result of the verification operation is determined as fail, the program voltage Vpgm is increased by a step voltage, and the operation of the semiconductor memory device is re-performed from the above-mentioned program voltage application step S210. When the result of the verification operation is determined as pass, a program operation for memory cells of a subsequent page may be performed.

According to an above-mentioned embodiment of the present disclosure, the verification operation is performed, after the electric charges trapped after the program voltage is applied have been rearranged by moving some of the electric charges in both side directions of the selected memory cell and the short-time retention characteristic has been reflected. Therefore, a problem of the threshold voltage distribution being reduced after the verification operation has been performed can be mitigated.

FIG. 11 is a flowchart illustrating a representation of an example of the operation of a semiconductor memory device according to an embodiment of the present disclosure.

FIGS. 12A and 12B are waveform diagram representations of examples of signals applied to the memory cell array when the semiconductor memory device is operated according to an embodiment of the present disclosure.

FIGS. 13A to 13D are diagrams illustrating representations of examples of the movement of electric charges trapped in a memory layer of a memory cell during the operation of the semiconductor memory device according to an embodiment of the present disclosure.

A method of operating the semiconductor memory device according to an embodiment of the present disclosure will be described with reference to FIGS. 1 to 4 and 11 to 13D.

The method of operating the semiconductor memory device according to an embodiment of the present disclosure is preferably performed before the program operation.

1) Applying a Program Voltage to Even Word Lines, and Applying a Pass Voltage to Odd Word Lines (S310)

The read-and-write circuit 130 sets the potentials of the bit lines BL1 to BLm of the memory cell array 110 to a program allowable level (e.g., 0V) in response to control signals PB_signals outputted from the control logic 140.

The voltage generator 150 generates a program voltage Vpgm, a first pass voltage Vpass1, and a drain control voltage VDSL in response to the control signals VG_signals outputted from the control logic 140. In response to an address ADDR and control signals AD_signals outputted from the control logic 140, the address decoder 120 applies the program voltage Vpgm to even word lines (WL0, WL2, . . . ) of the word lines WLs, applies the first pass voltage Vpass1 to odd word lines (WL1, WL3, . . . ), and applies a drain control voltage VDSL to the drain select line DSL.

Figure 13A:
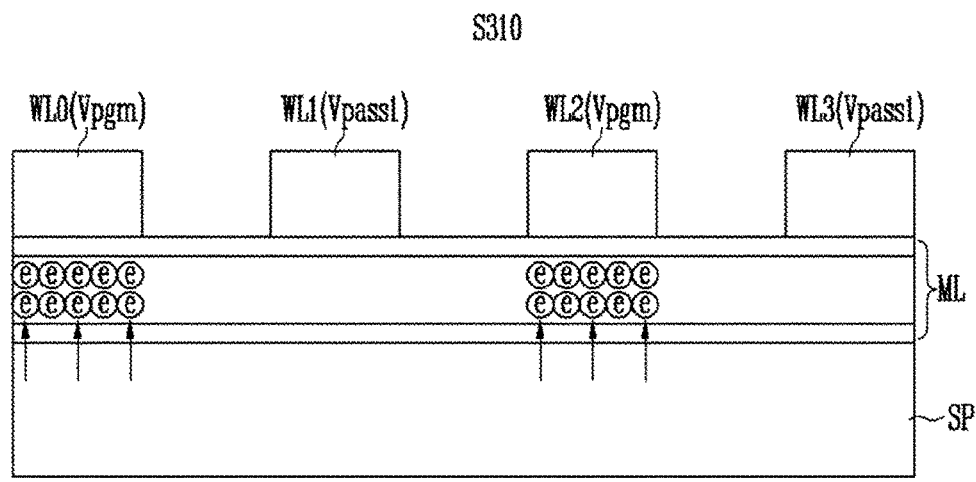
FIGS. 13A to 13D are diagrams illustrating representations of examples of the movement of electric charges trapped in a memory layer of a memory cell during the operation of the semiconductor memory device according to an embodiment of the present disclosure.

Referring to FIG. 13A, electric charges ( ) are drawn from the vertical channel layer SP into the memory layer ML of the even memory cells coupled to the even word lines WL0, WL2, . . . and are trapped in the memory layer ML. Therefore, the threshold voltage of the even memory cells is increased.

2) Discharging the Even Word Lines, and Applying the Program Voltage to the Odd Word Lines (S320)

In response to control signals VG_signals outputted from the control logic 140, the voltage generator 150 discharges the program voltage Vpgm that has been applied to the even word lines WL0, WL2, . . . to a voltage of 0V and applies the program voltage Vpgm to the odd word lines WL1, WL3, . . . to which the first pass voltage Vpass1 has been applied. The voltage generator 150 discharges the drain control voltage VDSL that has been applied to the drain select line DSL to a voltage of 0V. Thereby, the drain select transistor DST is turned off, whereby the vertical channel layer SP of the memory string is electrically separated from the corresponding bit line and thus enters a floating state. In this case, the source select transistor SST is in a turned-off state.

Figure 13B:
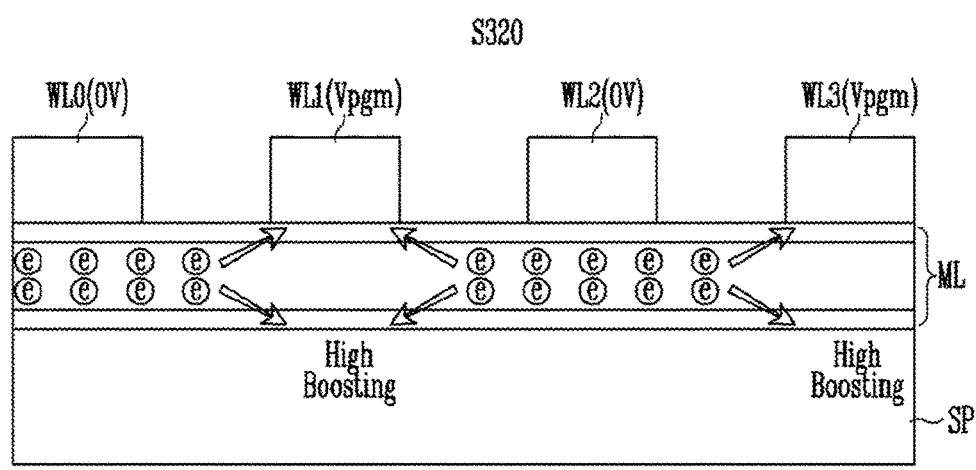

Therefore, as illustrated in FIG. 13B, portions of the vertical channel layer that are close to the odd memory cells coupled to the odd word lines to which the program voltage Vpgm is applied are boosted to a high potential level, and the even memory cells to which a voltage of 0V is applied are boosted to a relatively low potential level. Thereby, an electric field is formed by the program voltage Vpgm and the boosted potential of the portions of the vertical channel layer that are close to the odd word lines, so that some of the electric charges ( ) trapped in the memory layer ML of each even memory cell move in both side directions.

3) Erase Operation (S330)

After step S320, an erase operation is conducted to detrap the electric charges ( ) that have been trapped in the memory layer ML of the even memory cells. The erase operation is performed such that the electric charges ( ) that have moved in both side directions of each even memory cell remain. The erase operation may be performed by applying an erase voltage generated from the voltage generator 150 to the source lie SL of the memory cell array 110.

The erase operation S330 may be skipped before a subsequent step S340 is performed.

4) Applying a Program Voltage to the Odd Word Lines, and Applying a Pass Voltage to the Odd Word Lines (S340)

The voltage generator 150 generates a program voltage Vpgm, a first pass voltage Vpass1, and a drain control voltage VDSL in response to the control signals VG_signals outputted from the control logic 140. In response to an address ADDR and control signals AD_signals outputted from the control logic 140, the address decoder 120 applies the program voltage Vpgm to the odd word lines (WL1, WL3, . . . ) of the word lines WLs, applies the first pass voltage Vpass1 to the even word lines (WL0, WL2, . . . ), and applies the drain control voltage VDSL to the drain select line DSL.

Figure 13C:
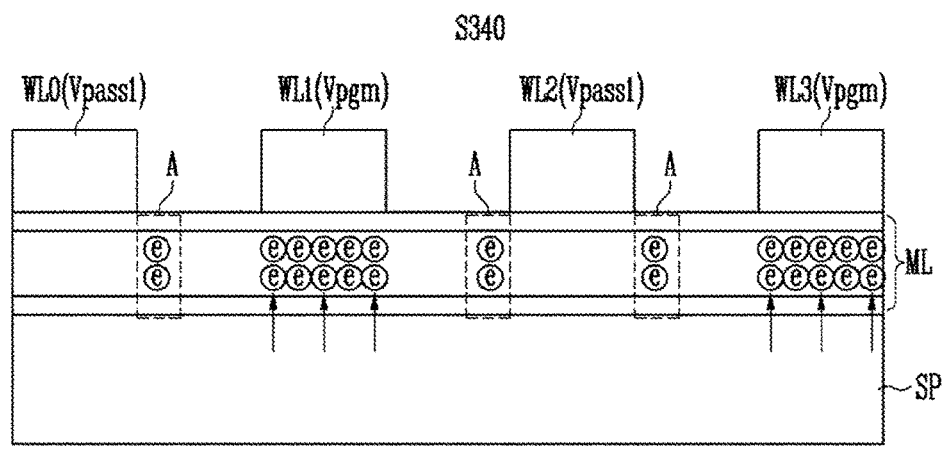

Referring to FIG. 13C, electric charges ( ) are drawn from the vertical channel layer SP into the memory layer ML of the odd memory cells coupled to the odd word lines WL1, WL3, . . . and are trapped in the memory layer ML. Therefore, the threshold voltage of the even memory cells is increased. Furthermore, electric charges ( ) that have been moved at step S320 remain on opposite sides of each of the memory cells.

5) Discharging the Odd Word Lines, and Applying the Program Voltage to the Even Word Lines (S350)

In response to control signals VG_signals outputted from the control logic 140, the voltage generator 150 discharges the program voltage Vpgm that has been applied to the odd word lines WL1, WL3, . . . to a voltage of 0V and applies the program voltage Vpgm to the even word lines WL0, WL2, . . . to which the first pass voltage Vpass1 has been applied.

The voltage generator 150 discharges the drain control voltage VDSL that has been applied to the drain select line DSL to a voltage of 0V. Thereby, the drain select transistor DST is turned off, whereby the vertical channel layer SP of the memory string is electrically separated from the corresponding bit line and thus enters a floating state. In this case, the source select transistor SST is in a turned-off state.

Figure 13D:
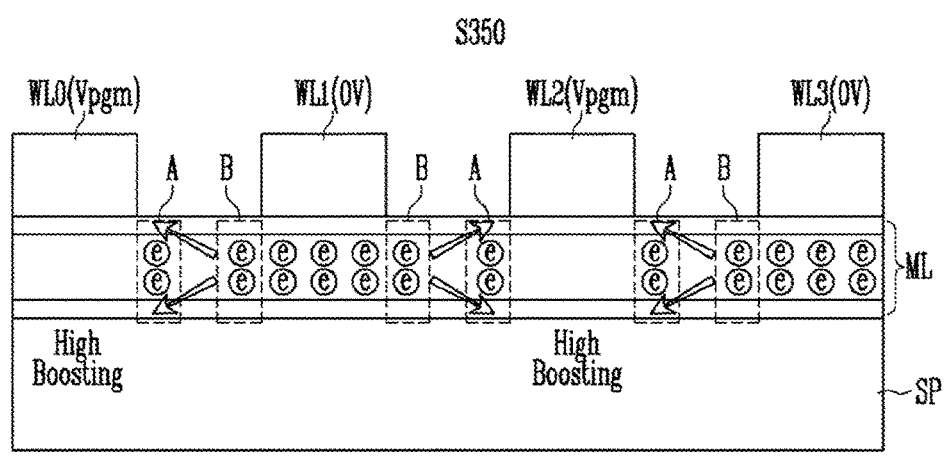

Therefore, referring to FIG. 13D, portions of the vertical channel layer that are close to the even memory cells coupled to the even word lines to which the program voltage Vpgm is applied are boosted to a high potential level, and the odd memory cells to which a voltage of 0V is applied are boosted to a relatively low potential level. Thereby, an electric field is formed by the program voltage Vpgm and the boosted potential of the portions of the vertical channel layer that are close to the even word lines, so that some of the electric charges ( ) trapped in the memory layer ML of each odd memory cell move in both side directions.

6) Erase Operation (S360)

After step S350, an erase operation is conducted to detrap the electric charges ( ) that have been trapped in the memory layer ML of the odd memory cells. The erase operation may be performed by applying an erase voltage generated from the voltage generator 150 to the source lie SL of the memory cell array 110. If the above-mentioned erase operation S330 is skipped, erase operations of the even memory cells and the odd memory cells are performed together at step S360. Preferably, the erase operation is performed such that the electric charges A and B that have been moved in both side directions of the corresponding memory cells remain.

Subsequently, the program operation may be performed.

According to an embodiment of the present disclosure, before the program operation is performed, electric charges can be trapped in advance in the memory layer between the memory cells so as to increase the density of charges. Therefore, during a subsequent program operation, a phenomenon in which electric charges trapped in the memory layer of each memory cell move in both side directions is restricted, whereby a problem of variation in threshold voltage can be mitigated.

FIG. 14 is a flowchart illustrating a representation of an example of the operation of a semiconductor memory device according to an embodiment of the present disclosure.

FIG. 15 is a waveform diagram representation of examples of signals applied to a memory cell array when the semiconductor memory device is operated according to an embodiment of the present disclosure.

FIGS. 16A to 16D are diagrams illustrating representations of examples of the movement of electric charges trapped in a memory layer of a memory cell during a program operation of the semiconductor memory device according to an embodiment of the present disclosure.

The method of operating the semiconductor memory device according to an embodiment of the present disclosure will be described with reference to FIGS. 1 to 4 and 14 to 16D.

The method of operating the semiconductor memory device according to an embodiment of the present disclosure is included in the erase operation of the semiconductor memory device and, in particular, preferably performed before an erase voltage application operation of the erase operation of the semiconductor memory device.

Furthermore, the method of operating the semiconductor memory device according to an embodiment of the present disclosure may be performed before the program operation.

1) Applying a Program Voltage to all of the Word Lines (S410)

The read-and-write circuit 130 sets the potentials of the bit lines BL1 to BLm of the memory cell array 110 to a program allowable level (e.g., 0V) in response to control signals PB_signals outputted from the control logic 140.

The voltage generator 150 generates a program voltage Vpgm and a drain control voltage VDSL in response to control signals VG_signals outputted from the control logic 140. In response to control signals AD_signals outputted from the control logic 140, the address decoder 120 applies the program voltage Vpgm to the word lines WLs and applies the drain control voltage VDSL to the drain select line DSL.

Figure 16A:
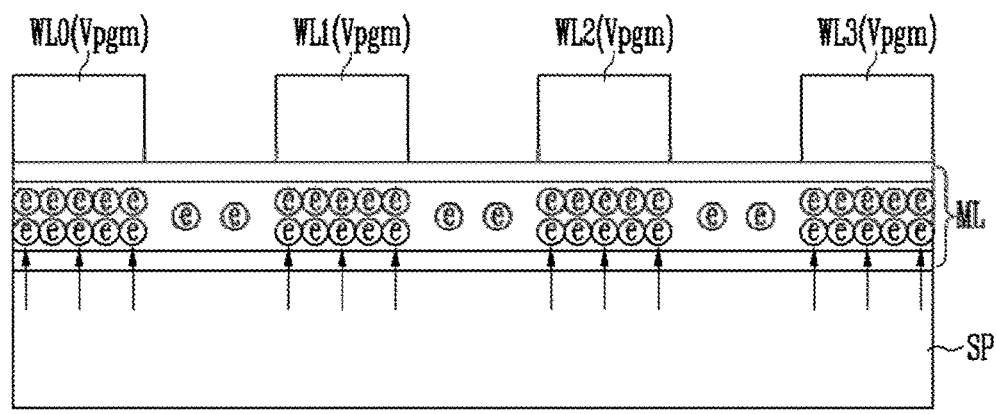
FIGS. 16A to 16D are diagrams illustrating representations of examples of the movement of electric charges trapped in a memory layer of a memory cell during a program operation of the semiconductor memory device according to an embodiment of the present disclosure.

Referring to FIG. 16A, electric charges ( ) are drawn from the vertical channel layer SP into the memory layer ML of all of the memory cells coupled to the respective word lines (WLs; WL0, WL2, WL3, . . . ) and are trapped in the memory layer ML. Some electric charges ( ) may be trapped in the memory layer ML between the memory cells by the program voltage Vpgm applied to all of the word lines WLs.

2) Discharging the Even Word Lines, and Discharging the Drain Control Voltage (S420)

The voltage generator 150 discharges, in response to control signals VG_signals outputted from the control logic 140, the potential level of the program voltage Vpgm that has been applied to the even word lines (WL0, WL2, ... ). For example, the program voltage Vpgm that has been to the even word lines WL0, WL2, . . . may be discharged to a voltage of 0V. The voltage generator 150 retains the potential level of the program voltage Vpgm applied to the odd word lines (WL1, WL3, . . . ). The voltage generator 150 discharges the drain control voltage VDSL that has been applied to the drain select line DSL to a voltage of 0V.

Figure 16B:
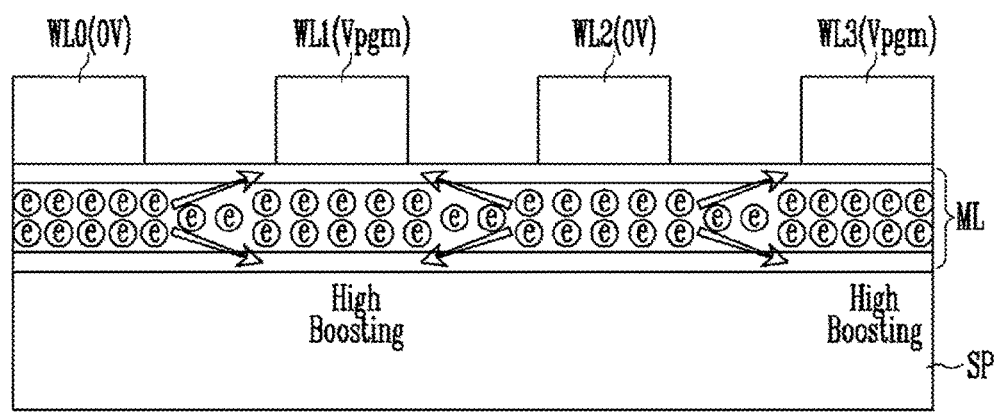

Therefore, referring to FIG. 16B, portions of the vertical channel layer that correspond to the odd memory cells coupled to the odd word lines to which the program voltage Vpgm is applied are boosted to a high potential level, and the even memory cells coupled to the even word lines from which the program voltage Vpgm has been discharged are boosted to a relatively low potential level. Thereby, an electric field is formed by the program voltage Vpgm and the boosted potential of the portions of the vertical channel layer that are close to the odd word lines, so that some of the electric charges ( ) trapped in the memory layer ML of each even memory cell move in both side directions.

3) Applying a Program Voltage to the Even Word Lines, and Discharging the Odd Word Lines (S430)

The voltage generator 150 discharges, in response to control signals VG_signals outputted from the control logic 140, the potential level of the program voltage Vpgm that has been applied to the odd word lines (WL1, WL3, . . . ). For example, the program voltage Vpgm that has been to the odd word lines WL1, WL3, . . . may be discharged to a voltage of 0V. The voltage generator 150 applies a program voltage Vpgm to the even word lines (WL0, WL2, . . . ).

Figure 16C:
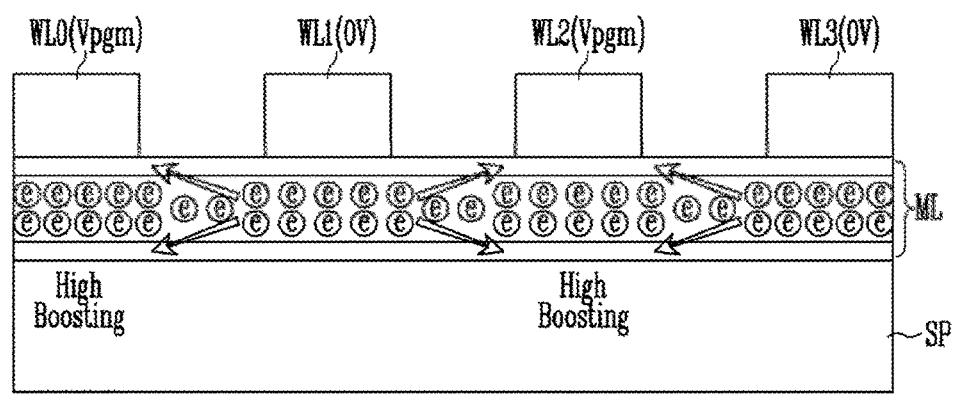
Figure 16D:
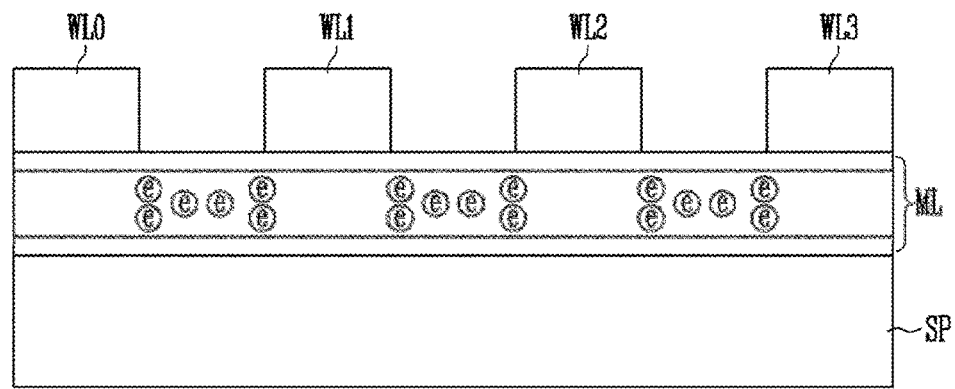

Therefore, referring to FIG. 16C, portions of the vertical channel layer that correspond to the even memory cells coupled to the even word lines to which the program voltage Vpgm is applied are boosted to a high potential level, and the odd memory cells coupled to the odd word lines from which the program voltage Vpgm has been discharged are boosted to a relatively low potential level. Thereby, an electric field is formed by the program voltage Vpgm and the boosted potential of the portions of the vertical channel layer that are close to the even word lines, so that some of the electric charges ( ) trapped in the memory layer ML of each odd memory cell move in both side directions.

4) Erase Operation (S440)

An erase operation is performed to detrap the electric charges ( ) that have been trapped in the memory layer ML of the even memory cells and the even memory cells. The erase operation is performed such that the electric charges ( ) that are trapped in the memory layer between the even memory cells and the odd memory cells remain. The erase operation may be performed by applying an erase voltage generated from the voltage generator 150 to the source lie of the memory cell array 100.

Subsequently, the program operation may be performed.

According to the present embodiment of the present disclosure, before the program operation is performed, electric charges can be trapped in advance in the memory layer between the memory cells so as to increase the density of charges. Therefore, during a subsequent program operation, a phenomenon in which electric charges trapped in the memory layer of the memory cells move in both side directions is restricted, whereby a problem of variation in threshold voltage can be mitigated.

Figure 17:
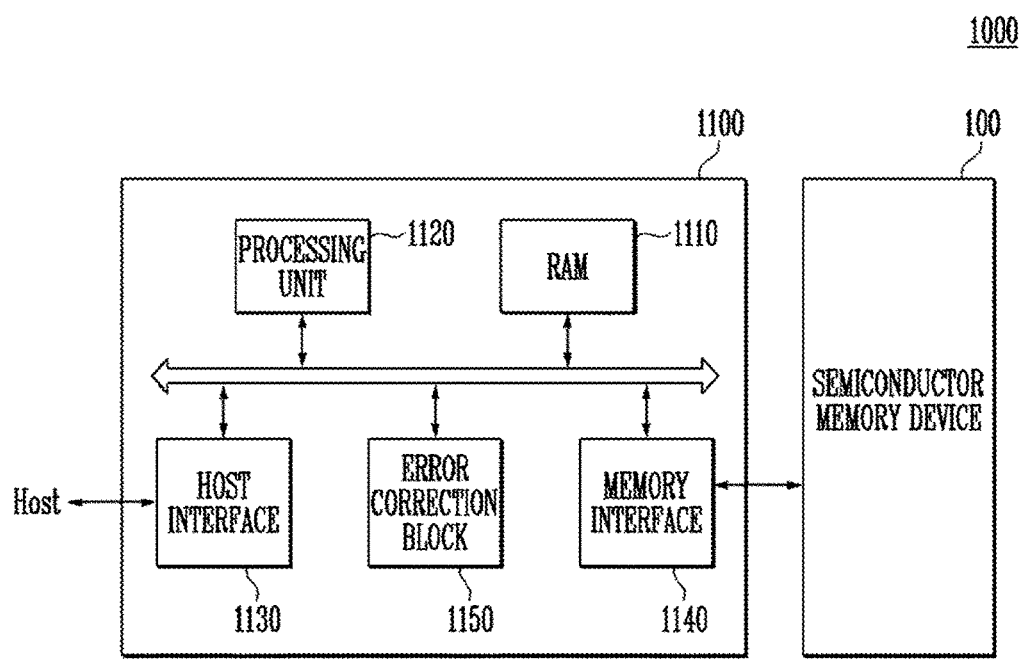
FIG. 17 is a block diagram illustrating a representation of an example of a memory system including the semiconductor memory device of FIG. 1.

FIG. 17 is a block diagram illustrating a representation of an example of a memory system including the semiconductor memory device of FIG. 1.

Referring FIG. 17, the memory system 1000 may include a semiconductor memory device 100 and a controller 1100.

The semiconductor memory device 100 may have the same configuration and operation as those of the semiconductor memory device described with reference to FIG. 1. Hereinafter, repetitive explanations will be omitted.

The controller 1100 is coupled to a host and the semiconductor memory device 100. In response to a request from the host, the controller 1100 accesses the semiconductor memory device 100. For example, the controller 1100 controls read, write, erase, and background operations of the semiconductor memory device 100. The controller 1100 is configured to provide an interface between the host and the semiconductor memory device 100. The controller 1100 is configured to drive firmware for controlling the semiconductor memory device 100.

The controller 1100 includes a RAM (random access memory) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host, and a buffer memory between the semiconductor memory device 100 and the host. The processing unit 1120 controls the overall operation of the controller 1100. In addition, the controller 1100 may temporarily store program data provided from the host during the write operation.

The host interface 1130 includes a protocol for performing data exchange between the host and the controller 1100. In an exemplary embodiment, the controller 1200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or NOR interface.

The error correction block 1150 uses an error correction code (ECC) to detect and correct an error in data received from the semiconductor memory device 100. The processing unit 1120 may adjust the read voltage according to an error detection result from the error correction block 1150, and control the semiconductor memory device 100 to perform re-reading. In an exemplary embodiment, the error correction block may be provided as an element of the controller 1100.

The controller 1100 and the semiconductor memory device 100 may be integrated into a single semiconductor device. In an exemplary embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host coupled to the memory system 2000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an example of an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 18:
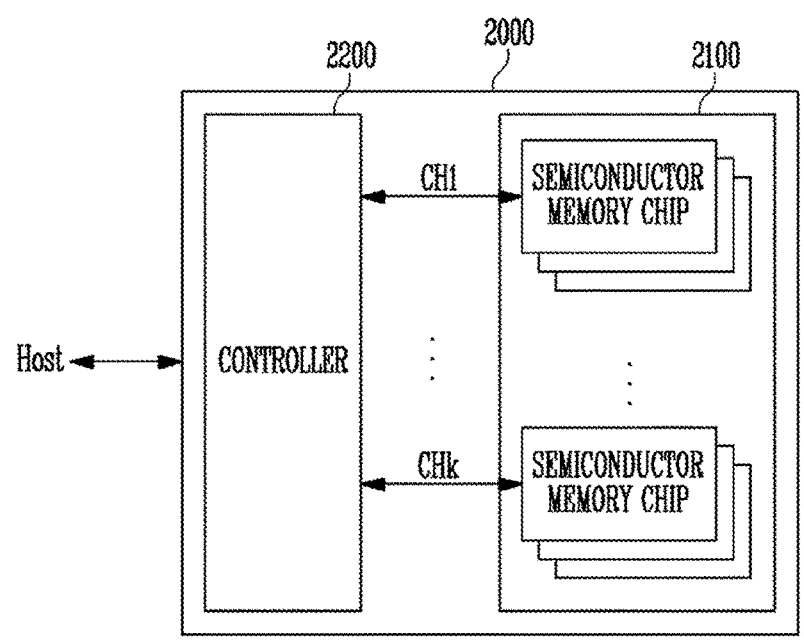
FIG. 18 is a block diagram illustrating a representation of an example of an application example of the memory system of FIG. 17.

FIG. 18 is a block diagram illustrating a representation of an example of an application example of the memory system of FIG. 17.

Referring FIG. 18, the memory system 2000 may include a semiconductor memory device 2100 and a controller 2200. The semiconductor memory device 2100 includes a plurality of memory chips. The semiconductor memory chips are divided into a plurality of groups.

Referring to FIG. 18, it is illustrated that each of the plurality of groups communicates with the controller 2200 through first to k-th channels CH1 to CHk. Each semiconductor memory chip is configured to operate in the same manner as that of an embodiment of the semiconductor memory device 100 described with reference to FIG. 1.

Each group communicates with the controller 2200 through one common channel. The controller 2200 has the same configuration as that of the controller 1100 described with reference to FIG. 17 and is configured to control a plurality of memory chips of the semiconductor memory device 2100 through the plurality of channels CH1 to CHk.

Figure 19:
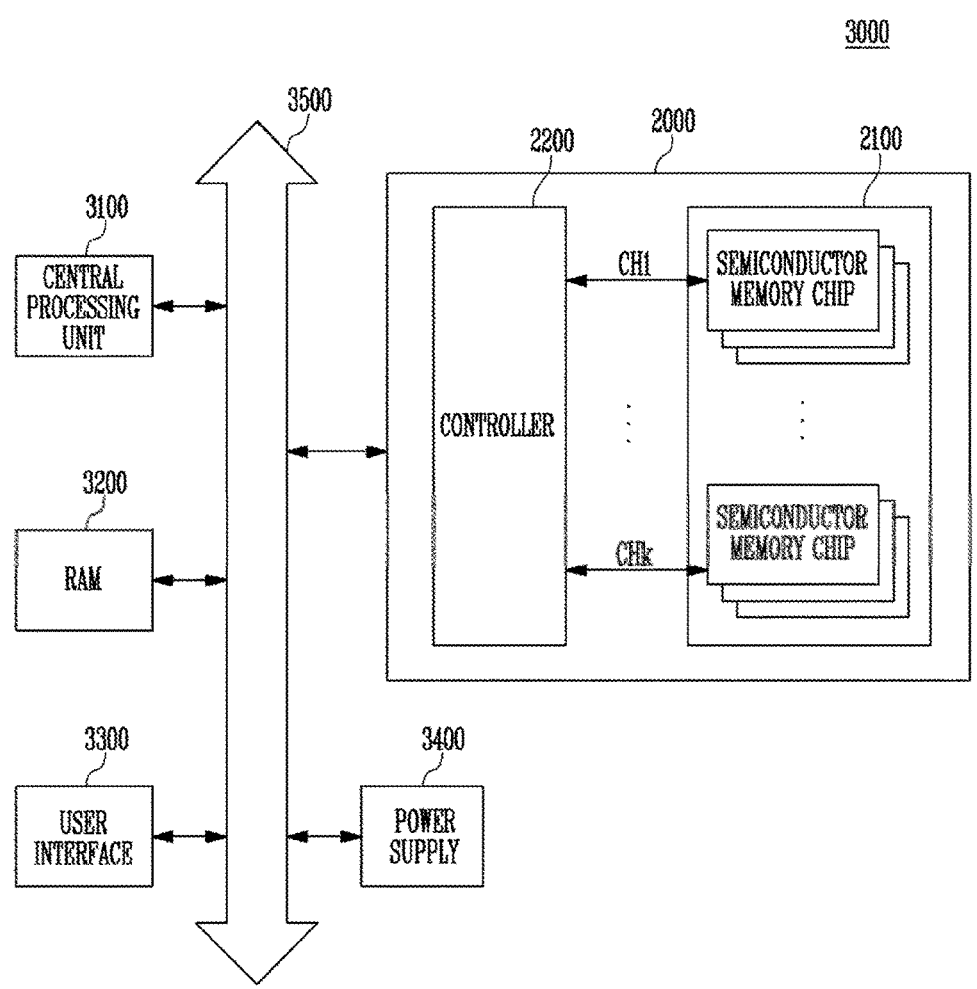
FIG. 19 is a block diagram illustrating a representation of an example of a computing system including the memory system illustrated with reference to FIG. 18.

FIG. 19 is a block diagram illustrating a representation of an example of a computing system including the memory system illustrated with reference to FIG. 18.

Referring to FIG. 19, the computing system 3000 may include a central processing unit 3100, a RAM 3200, a user interface 3300, a power supply 3400, a system bus 3500, and a memory system 2000.

The memory system 2000 is electrically connected to the CPU 3100, the RAM 3200, the user interface 3300, and the power supply 3400 through the system bus 3500. Data provided through the user interface 3300 or processed by the CPU 3100 is stored in the memory system 2000.

Referring to FIG. 19, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

Referring to FIG. 19, the memory system 2000 described with reference to FIG. 18 is illustrated as being used. However, the memory system 2000 may be replaced with the memory system 1000 described with reference to FIG. 17. In an embodiment, the computing system 3000 may include all of the memory systems 1000 and 2000 described with reference to FIGS. 17 and 18. Various embodiments of the present disclosure can overcome retention deterioration characteristics of a semiconductor memory device, thus solving a problem of a reduction in threshold voltage of memory cells due to retention deterioration characteristics.

Examples of embodiments have been disclosed herein, and although specific terms are employed, they are used and are to be interpreted in a generic and descriptive sense only and not for the purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A semiconductor memory device, comprising:
a memory cell array including a drain select transistor and a plurality of memory cells;
a voltage generator configured to apply a program voltage, and first and second pass voltages to the memory cell array; and
a control logic configured to control the voltage generator to apply the program voltage to a selected memory cell of the plurality of memory cells during a program operation, apply the first pass voltage to remaining non-selected memory cells, and apply the second pass voltage higher than the first pass voltage to memory cells adjacent to the selected memory cell of the non-selected memory cells after completing discharging the program voltage applied to the selected memory cell.

2. The semiconductor memory device according to claim 1, wherein the control logic controls the voltage generator so that the program voltage applied to the selected memory cell is discharged to a voltage of 0V.

3. The semiconductor memory device according to claim 1,
wherein the voltage generator is configured to apply a drain control voltage to the memory cell array, and
wherein the control logic controls the voltage generator so that:
when the program voltage is applied to the selected memory cell, the drain control voltage is applied to the drain select transistor of the memory cell array; and
when the program voltage applied to the selected memory cell is discharged, the drain control voltage is discharged so that the drain select transistor is turned off.

4. The semiconductor memory device according to claim 1, wherein the control logic controls the voltage generator so that the second pass voltage applied to the memory cells adjacent to the selected memory cell is discharged after a predetermined period of time has passed after the program voltage has been discharged.

5. The semiconductor memory device according to claim 4, wherein the control logic controls the voltage generator so that a verification voltage is applied to the selected memory cell after the second pass voltage applied to the memory cells adjacent to the selected memory cell is discharged.

6. The semiconductor memory device according to claim 5, wherein the voltage generator applies the verification voltage to the selected memory cell, and then floats word lines of the memory cell array.

7. The semiconductor memory device according to claim 5, wherein when the voltage generator applies the verification voltage to the selected memory cell the voltage generator applies a third pass voltage to the memory cells adjacent to the selected memory cell.

* * * * *